United States Patent
Hsu et al.

(10) Patent No.: US 6,506,643 B1
(45) Date of Patent: Jan. 14, 2003

(54) METHOD FOR FORMING A DAMASCENE FERAM CELL STRUCTURE

(75) Inventors: Sheng Teng Hsu, Camas, WA (US); David Russell Evans, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/330,900

(22) Filed: Jun. 11, 1999

(51) Int. Cl.[7] ................ H01L 21/8242; H01L 21/00
(52) U.S. Cl. ................ 438/240; 438/3; 257/295; 257/310
(58) Field of Search ................ 257/295, 310; 438/240, 244, 3

(56) References Cited

U.S. PATENT DOCUMENTS

| | | | | |
|---|---|---|---|---|
| 5,330,931 A | * | 7/1994 | Emesh et al. | 438/3 |
| 5,585,300 A | * | 12/1996 | Summerfelt | 438/2 |
| 5,696,017 A | * | 12/1997 | Ueno | 438/240 |
| 6,017,790 A | * | 1/2000 | Liou et al. | 438/240 |
| 6,320,244 B1 | * | 11/2001 | Alers et al. | 257/532 |

* cited by examiner

Primary Examiner—Olik Chaudhuri
Assistant Examiner—Howard Weiss
(74) Attorney, Agent, or Firm—David C. Ripma; Matthew D. Rabdau; Scott C. Krieger (57) ABSTRACT

A three-dimensional ferroelectric structure and fabrication method are provided. The ferroelectric capacitor structure permits immediate contact between a noble metal capacitor electrode and a transistor electrode. This direct connection minimizes process steps and electrical resistance between capacitor and transistor. A damascene capacitor electrode formation process makes the task of etching the noble metal less critical. Regardless of whether a noble metal capacitor electrode is used, the damascene formation process permits both larger, and more space efficient, capacitors. Further, the damascene capacitor formation process can be used to simultaneously form electrical interlevel interconnections to the transistor drain. Another variation of the invention provides for a dual damascene version of the ferroelectric capacitor.

23 Claims, 7 Drawing Sheets

METHOD FOR FORMING A DAMASCENE FERAM CELL STRUCTURE

BACKGROUND AND SUMMARY OF THE INVENTION

The present invention is generally related to the fabrication of integrated circuits (ICs) and, more specifically, to the fabrication of a three-dimensional, one transistor/one capacitor (1T/1C), ferroelectric structure.

Platinum (Pt) and other noble metals are used in IC ferroelectric capacitors. The use of noble metals is motivated by their inherent chemical resistance. This property is especially desirable under high temperature oxygen annealing conditions, such as those seen in the fabrication of ferroelectric capacitors. In addition, chemical interaction between noble metals and ferroelectric materials, such as perovskite metal oxides, is negligible.

The above-mentioned noble metals are used as conductive electrode pairs separated by a ferroelectric material. One, or both of the electrodes are often connected to transistor electrodes, or to electrically conductive traces in the IC. As is well known, these ferroelectric devices can be polarized in accordance with the voltage applied to the electrode, with the relationship between charge and voltage expressed in a hysteresis loop. When used in memory devices, the polarized ferroelectric device can be used to represent a "1" or a "0". These memory devices are often called ferro-RAM, or FeRAM. Ferroelectric devices are nonvolatile. That is, the device remains polarized even after power is removed from the IC in which the ferroelectric is imbedded.

There are problems in the use of noble metal electrodes. Platinum (Pt), iridium (Ir), palladium (Pd), rhodium (Rh), and the other noble metals are notoriously difficult to remove by standard etching techniques. Therefore, it is difficult to form noble metal electrodes through conventional metal deposition techniques that rely on selective etching to form the electrode areas. As a result, extra process steps must be added to the fabrication process to electrically connect a transistor electrode to a noble metal ferroelectric capacitor electrode.

In co-pending patent application Ser. No. 09/247,655, entitled "Chemically Active Slurry for the Patterning of Noble Metals and Method for Same", invented by David R. Evans, filed on Mar. 3, 1999, a method is described for removing a noble metal film using a CMP process. The above-mentioned co-pending patent application is incorporated herein by reference.

It would be advantageous if a ferroelectric electrode could be fabricated using a noble metal without the complicated process steps needed to etch and form a noble metal electrode.

It would be advantageous if a noble metal electrode could be fabricated directly adjoining a transistor electrode without the need of an electrical interconnection structure. It would be advantageous to minimize the resistance between the bottom electrode of a ferroelectric capacitor and a transistor electrode.

It would be advantageous if the capacitance associated with a ferroelectric capacitor could be increased without complicated process steps, and increasing the cell area.

Accordingly, a ferroelectric device has been provided comprising a transistor including a source, and a ferroelectric capacitor. The ferroelectric capacitor includes a bottom electrode layer, including a noble metal, directly overlying and in contact with the transistor source. A ferroelectric film overlies the bottom electrode layer and a top electrode layer overlies the ferroelectric film. In this manner, a noble metal electrode is formed without any intervening structures between the source and the bottom electrode.

A IC insulator, having a top surface, is deposited over the transistor, and a via, with via sidewalls, is formed between the IC insulator top surface and the source. The bottom electrode is formed to overlie the via sidewalls, as well as the source. A ferroelectric film is formed over the bottom electrode, and a top electrode is formed over the ferroelectric film. In this manner, a three-dimensional capacitor structure is formed in the via from consecutive linings of the top electrode over the ferroelectric, over the bottom electrode. Therefore, the diameter of the via includes at least two thickness of bottom electrode, two thicknesses of ferroelectric material, and at least one thickness of top electrode.

Alternately, a dual damascene structure is formed in the IC insulator which includes a first trench in addition to the first via. Then, the bottom electrode, ferroelectric film, and the top electrode are layered to overlie the via and trench bottoms and sidewalls so that the volume of the ferroelectric capacitor can be increased. The trench can be formed over the transistor gate electrode to conserve space.

In another alternative, an electrical interconnection is formed to the drain, simultaneous with the formation of the ferroelectric capacitor. Then, a via is formed, extending from the IC insulator top surface to the drain. The bottom electrode material is formed over the exposed drain areas and the drain via sidewalls. The bottom electrode material provides an interconnect between the drain and an overlying metal level. Typically, a ferroelectric film is formed over the bottom electrode material in the drain via. The drain via has a diameter that is no larger than the minimum size contact hole size of the associated IC technology, plus the two thicknesses of bottom electrode lining the via.

A method of forming the above-mentioned ferroelectric device is also provided. The method comprises the steps of:

a) forming a transistor; and b) forming a ferroelectric capacitor bottom electrode, including a noble metal, immediately overlying the source of the transistor. The ferroelectric capacitor is formed without an intervening electrical connector between the source and bottom electrode. Additional steps precede Step b), of:

$a_1$) forming an IC insulator layer with a top surface overlying the source; and $a_2$) forming a via opening, with a via bottom and via sidewalls, extending from the IC insulator layer top surface to selected area of the transistor first electrode, whereby a damascene ferroelectric capacitor structure is formed. Step b) includes forming the bottom electrode over the bottom of the via and the via sidewalls. Further steps, follow Step b), of:

c) forming a ferroelectric film over the bottom electrode; and d) forming a top electrode layer over the ferroelectric film, whereby the via bottom and sidewalls are lined with the top electrode over the ferroelectric film, over the bottom electrode.

Step b) includes isotropically depositing a noble metal material overlying the IC insulator top surface, via sidewalls, and source. Then, the bottom electrode material, overlying the IC insulator top surface, is removed. The removal process entails: a) depositing nitride over the IC insulator top surface and source; b) chemical mechanically polishing (CMP) to remove the nitride and bottom electrode material over the IC insulator top surface; and c) etching to remove the nitride, not removed in the previous step, in the via over the source, whereby the bottom electrode material is left overlying the first via sidewalls and the source. Nitride is particularly useful when the IC insulator material is an oxide because of the etch selectivity between the two materials.

After conformal deposition of the ferroelectric film in Step c), and conformal deposition of the top electrode material in Step d), Step e) etches the top electrode material overlying the first IC insulator top surface. Typically, the ferroelectric film over the IC insulator top surface is removed in the same process.

An interconnection is formed to the transistor drain simultaneous with the formation of the ferroelectric capacitor. Step $a_2$) includes forming a second via extending from the IC insulator layer top surface to the drain. Step b) forms a bottom electrode layer over the drain and drain via sidewalls. Typically, Step c) forms a ferroelectric film over the bottom electrode layer, but it is not required.

Alternately, Step $a_2$) includes forming a dual damascene opening in the first IC insulator including the via and a trench, with via and trench bottoms, and via and trench sidewalls. Step b) includes forming the ferroelectric capacitor bottom electrode overlying the transistor first electrode in the dual damascene opening. Specifically, Step b) includes isotropically depositing the bottom electrode material overlying the first via and first trench bottom and sidewalls, Step c) includes isotropically depositing the ferroelectric film material over the bottom electrode, and Step d) includes isotropically depositing the top electrode layer overlying the ferroelectric.

DETAILED DESCRIPTION OF THE PREFERRED EMBODIMENT

Figure 1:
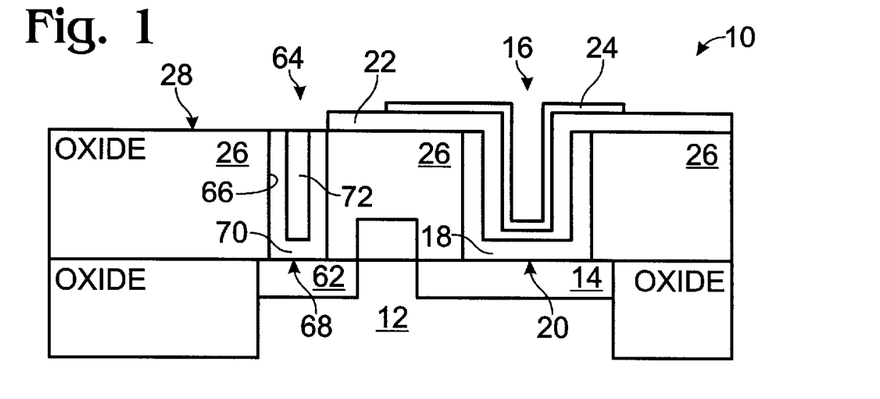
FIGS. 1 illustrates a completed ferroelectric device of the present invention.

FIGS. 1 illustrates a completed ferroelectric device of the present invention. Ferroelectric 10 comprises a transistor 12 including a first electrode 14. In some aspects of the invention first electrode 14 is a source. Transistor 10 is depicted a bulk style transistor. Alternately (but not shown), transistor 10 is a silicon on insulator (SOI) style transistor.

A ferroelectric capacitor 16 is shown, further comprising a first bottom electrode, or first bottom electrode layer 18. First bottom electrode 18 immediately overlies, and is directly in contact with, selected areas 20 of transistor first electrode 14. In some aspects of the invention, first bottom electrode 18 includes a noble metal. Then, first bottom electrode 18 is made of material selected from the group consisting of Pt, Ir, Pd, Rh, $IrO_2$ and alloys and compounds of the above-mentioned noble metals. In some aspects of the invention, bottom electrode 18 is not limited to nobles metals. Transitions metal and transition metal compounds, such as Ta and TaN, are also used.

A first ferroelectric film 22 overlies first bottom electrode layer 18. First ferroelectric film 22 is made from material selected from the group consisting of lead germanate (PGO), $PbZr_{1-x}Ti_xO_3$ (PZT), $SrBi_2Ta_2O_9$ (SBT), $SrBi_2(Ta_{1-x}Nb_x)_2O_9$(SBTN), $(Pb_{1-x}La_x)TiO_3$(PLT), and $(Pb_{1-x}La_x)(Zr_{1-y}Ti_y)O_3$(PLZT). A first top electrode layer 24 overlies ferroelectric film 22. Ferroelectric capacitor 16 is formed without intermediate connecting structures between transistor first electrode 14 and first bottom electrode 18. First top electrode 24 is a noble metal in some aspects of the invention.

Figure 2:
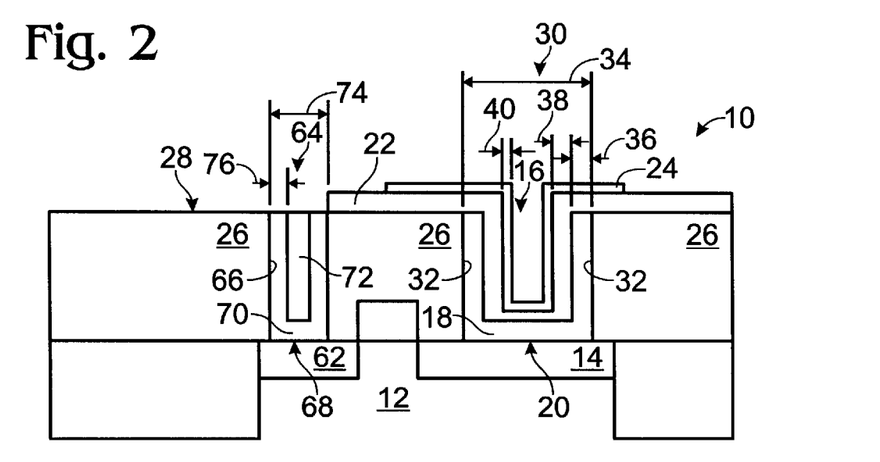
FIG. 2 illustrates the ferroelectric device of FIG. 1 with dimensional details.

FIG. 2 illustrates ferroelectric device 10 of FIG. 1 with dimensional details. A first dielectric interlevel 26 having a top surface 28 overlies transistor first electrode 14. First dielectric interlevel 26 includes a first via 30, with first via sidewalls 32, extending from first dielectric interlevel top surface 28 to selected area 20 of transistor first electrode 14. First bottom electrode 18 overlies first dielectric interlevel first via 30, lining first via sidewalls 32, and adjoining selected area 20. Likewise, first ferroelectric film 22 overlies first bottom electrode 18, lining first via sidewalls 32. It is understood that ferroelectric 22 forms a hollow cylindrical structure with a bottom so that the so-called bottom of the via, where bottom electrode 18 is directly adjacent selected area 20, is lined as well as sidewalls 32. First top electrode 24 overlies first ferroelectric film 22, lining first via sidewalls 32 and the so-called via bottom which is a layer of ferroelectric film 22, over bottom electrode 18, over selected area 20. First top electrode 24 forms either a solid cylinder or a hollow cylinder with a bottom. In this manner, three-dimensional capacitor structure 16 is formed (see FIG. 1).

Prior art ferroelectric capacitors can be considered to have a two dimensional structure, where the electrode and ferroelectric film structures have a length and width, but no height. Of course, these devices actually have a height, but the height is limited to the deposition process which forms the films. That is, there is a lack of practical control in adjusting the height, or thickness of such films. In the present invention the damascene deposition process permits much greater control over the size of ferroelectric capacitor. The capacitance of the present invention device is adjusted through control of the dielectric interlevel thickness 33 and control of via diameters, as well as control over the electrode material deposition process. Dielectric interlevel thickness 33 is in the range of approximately 0.5 to 1 micron.

First via 30 has a first diameter ($D_1$) 34. The following explanation assumes that via 30 is a cylinder, but the below-mentioned dimensional concepts apply to any shape damascene opening. First bottom electrode 18 has a thickness ($T_{BE}$) 36, and first top electrode 24 has a thickness ($T_{TE}$) 38. First ferroelectric film 22 has a thickness ($T_F$) 40. $D_1$ is greater than approximately $2(T_{BE})+(T_{TE})+2(T_F)$. Typically, $D_1$ is much greater than $2(T_{BE})+(T_{TE})+2(T_F)$ to provide sufficient capacitance. At the time of this writing, technology permits $T_{BE}$ and $T_{TE}$ to be in the range of approximately 0.1 to 0.2 microns, and $T_F$ to be in the range of approximately 0.1 to 0.4 microns.

Figure 3:
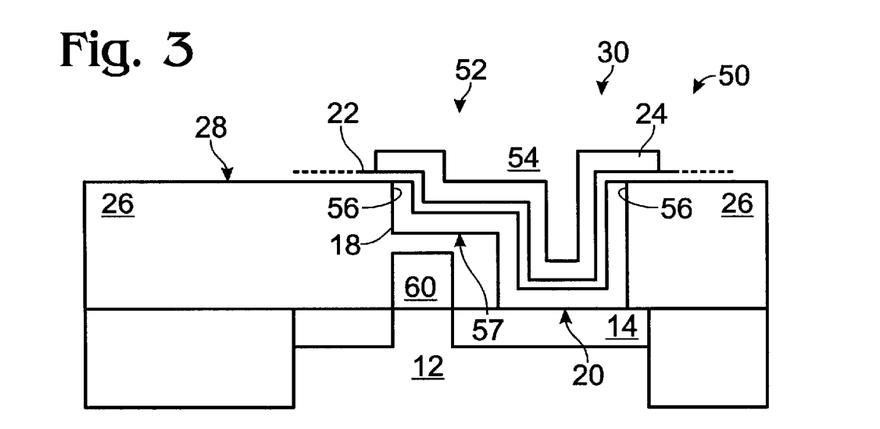
FIG. 3 illustrates an alternate ferroelectric device of the present invention.

FIG. 3 illustrates an alternate ferroelectric device 50 of the present invention. Many of the features of FIG. 3 are the same as shown in FIG. 1. First dielectric interlevel 26 includes a first trench 52, in addition to first via 30, to form a dual damascene opening 54. First via sidewalls 28 and first trench sidewalls 56 are formed. First trench 52 has a trench bottom 57. First bottom electrode 18, first ferroelectric film 22, and first top electrode 24 overlie first via and first trench sidewalls 28/56, as well as the via bottom adjacent selected surface 20 and trench bottom 57. In this manner, the area of ferroelectric capacitor 58 is made larger than the area (and capacitance) of ferroelectric capacitor 16 of FIG. 1.

Transistor 12 also includes a gate electrode 60. First dielectric interlevel 26 is formed overlying gate electrode 60. Dual damascene trench 52 is formed, at least partially, overlying gate electrode 60, whereby the space surrounding transistor 12 is optimally occupied.

Returning to FIG. 1, ferroelectric device 10 is depicted with a drain interconnect structure. The same drain interconnect structure is also applicable to ferroelectric device 50 of FIG. 3. Transistor 12 includes a second electrode 62. Typically, first electrode 14 is a source and second electrode 62 is a drain. However, the concept applies to the connection of any type of electrode. First dielectric interlevel 26 overlies transistor second electrode 62. First dielectric interlevel 26 includes a second via 64, with second via sidewalls 66, extending from first dielectric interlevel top surface 28 to a selected area 68 of transistor second electrode 62.

A second bottom electrode 70 immediately overlies transistor second electrode selected areas 68. Structure 70 is more accurately termed an interconnect structure, however, it is typically formed in the same processes that deposit and form first bottom electrode 18. Likewise, when first bottom electrode 18 is a noble metal, second bottom electrode 70 is typically a noble metal. Second bottom electrode 70 overlies second via 64, lining said second via sidewalls 66. In this manner, an electrical interconnection 70 is made to transistor second electrode 62 through first dielectric interlevel 26. A second ferroelectric film 72 overlies second bottom electrode 62.

Returning to FIG. 2, second via 64 has a second diameter ($D_2$) 74. Second bottom electrode 70 has a thickness ($T_{BE}$) 76. Depending on the associated IC technological standards, there is a minimum diameter contact hole size defined by $D_{OC}$. $D_2$ is greater than approximately $2(T_{BE})+D_{OC}$. Even with tolerance errors such a diameters allows interconnect structure 70 to connect with subsequently formed via interconnects to higher metal levels. The standards as of this writing permit a $D_{OC}$ of approximately 0.2 microns.

Figure 4:
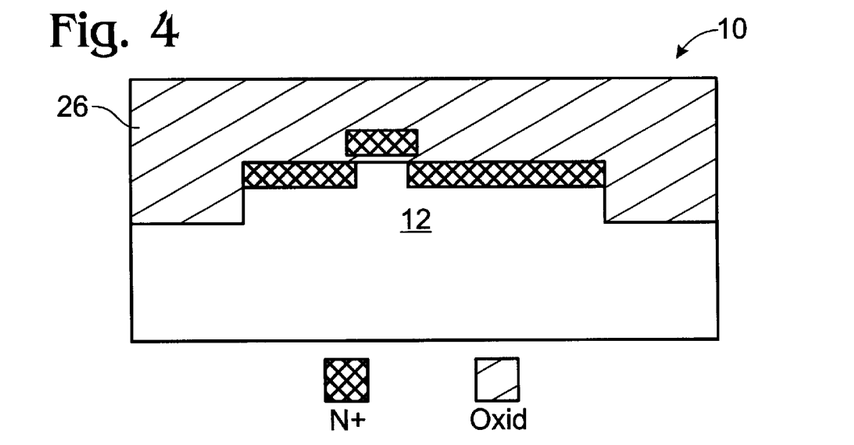
FIGS. 4–9 illustrate steps in completing the ferroelectric device of the present invention.

FIGS. 4–9 illustrate steps in completing ferroelectric device 10/50 of the present invention. FIG. 4 depicts transistor 10 covered by dielectric interlevel 26. Typically, dielectric interlevel 26 is $SiO_2$, or other oxide material.

Figure 5A:
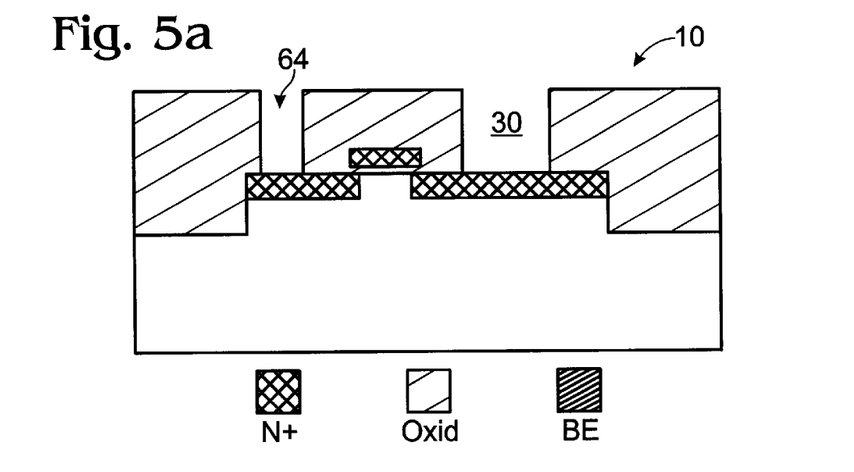
Figure 5B:
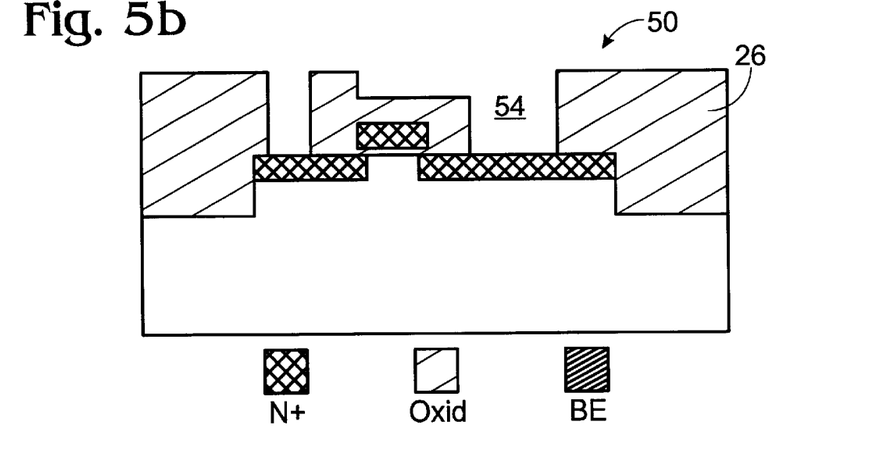

FIGS. 5a and 5b illustrate the formation of damascene structures. FIG. 5a depicts the formation of first via 30 and second via 64 of FIG. 1. FIG. 5b depicts dual damascene structure 54 of FIG. 3. The various damascene structures are typically made through the process of depositing photoresist, patterning the photoresist, and etching the portions of dielectric interlevel 26 exposed by patterning. Damascene structure 54 is made through either a two-step process of patterning and etching, or using a multi-level photoresist mask as taught in co-pending patent application entitled, METHOD FOR TRANSFERRING A MULTI-LEVEL PHOTORESIST PATTERN, filed Jun. 10, 1996, by Nguyen, Hsu, Ulrich, Maa, and Peng, Ser. No. 08/665,014.

Figure 6A:
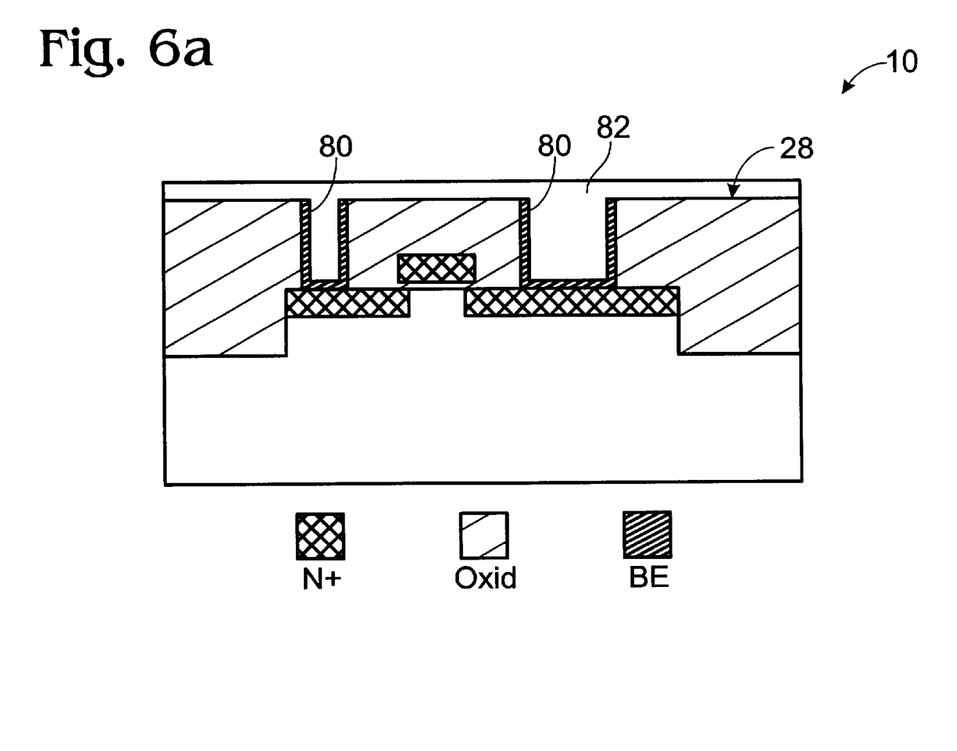

FIG. 6a illustrates the deposition of bottom electrode material 80 isotropically over the entire ferroelectric structure 10 of FIG. 5a. The same process would occur in the fabrication of ferroelectric device 50 of FIG. 5b. In some aspects of the invention, electrode material 80 is a noble metal, which is difficult to etch. CMP process are sometimes used to remove bottom electrode material 80 overlying interlevel dielectric top surface 28. However, a CMP process may damage the structural integrity of electrode material 80 lining the various sidewalls. Alternately (as shown), nitride 82 is deposited over bottom electrode material 80. Then a CMP process is preformed to remove materials 80 and 82 from top surface 28. Nitride 82 in the damascene structures prevents damage to bottom electrode 80 lining the sidewalls. After the CMP, nitride 82 is etched from the various damascene structures.

Figure 6B:
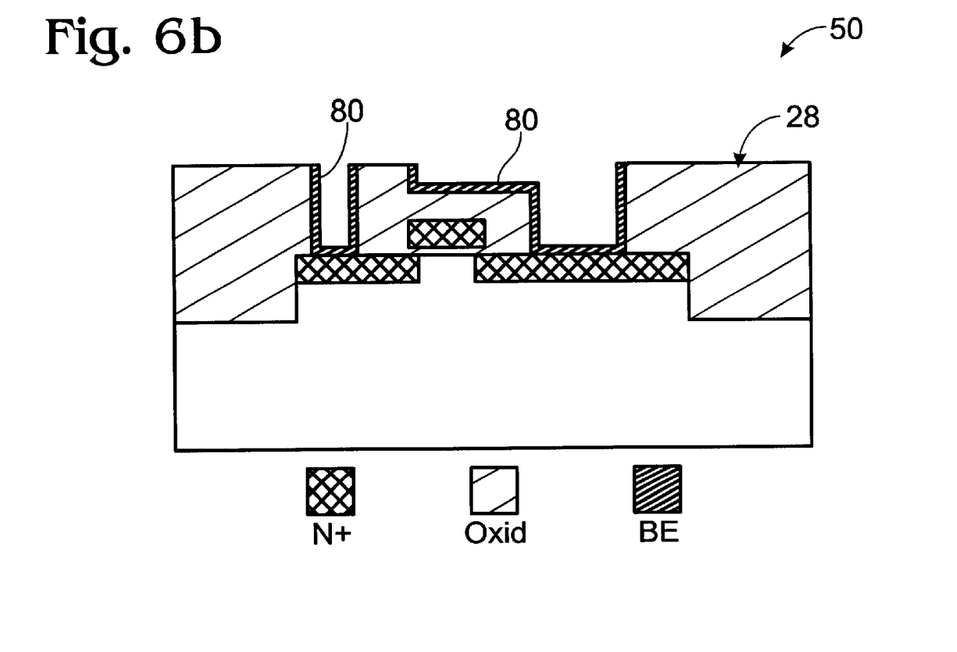

FIG. 6b illustrates ferroelectric device 50 of FIG. 5b following the CMP and nitride etch processes. First bottom electrode 18 and second bottom electrode 70 result. Ferroelectric device 10 of FIG. 6a is similarly formed after a CMP and nitride etching process.

Figure 7A:
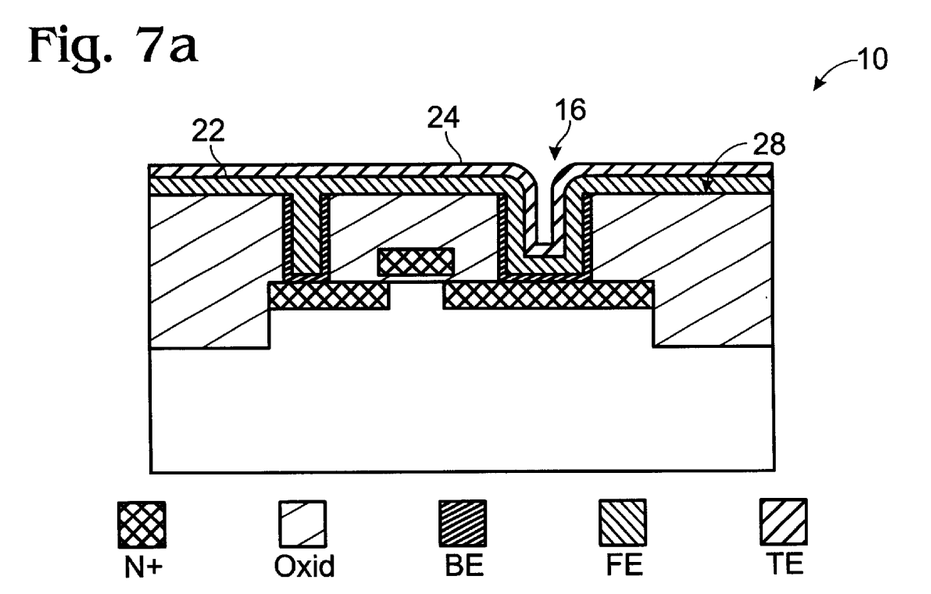
Figure 7B:
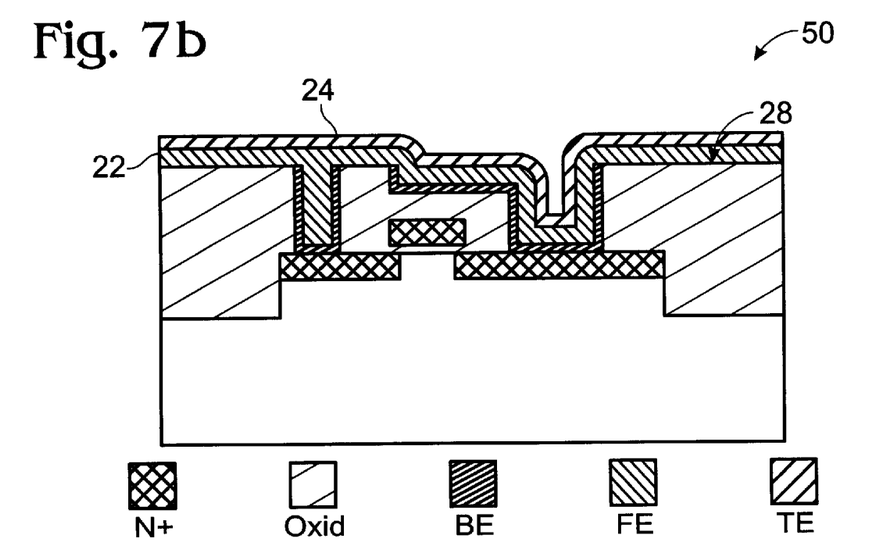

FIGS. 7a and 7b depicts the deposition of ferroelectric film 22 and top electrode material 24 on ferroelectric devices 10 of FIG. 6a (after CMP and nitride etching) and ferroelectric device 50 of FIG. 6b, respectively.

Figure 8A:
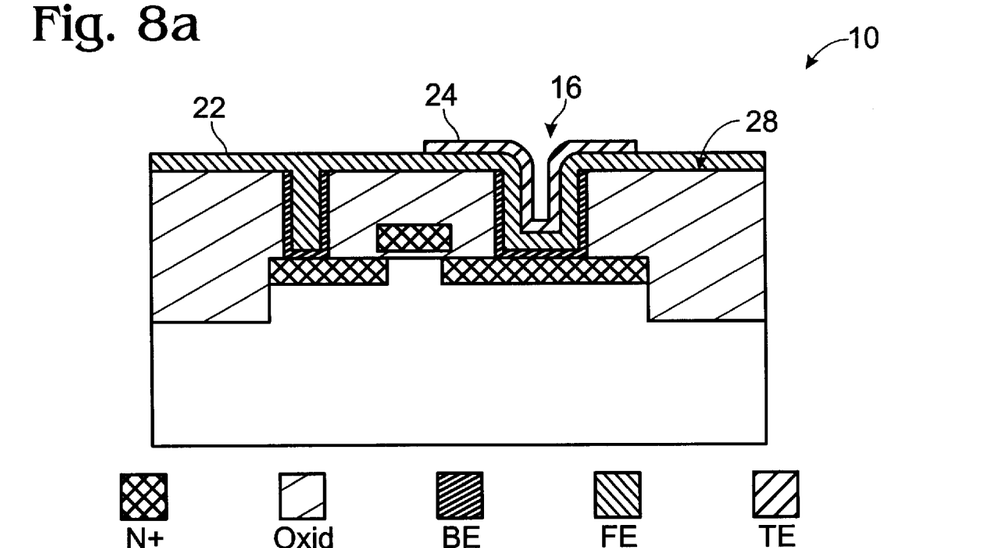
Figure 8B:
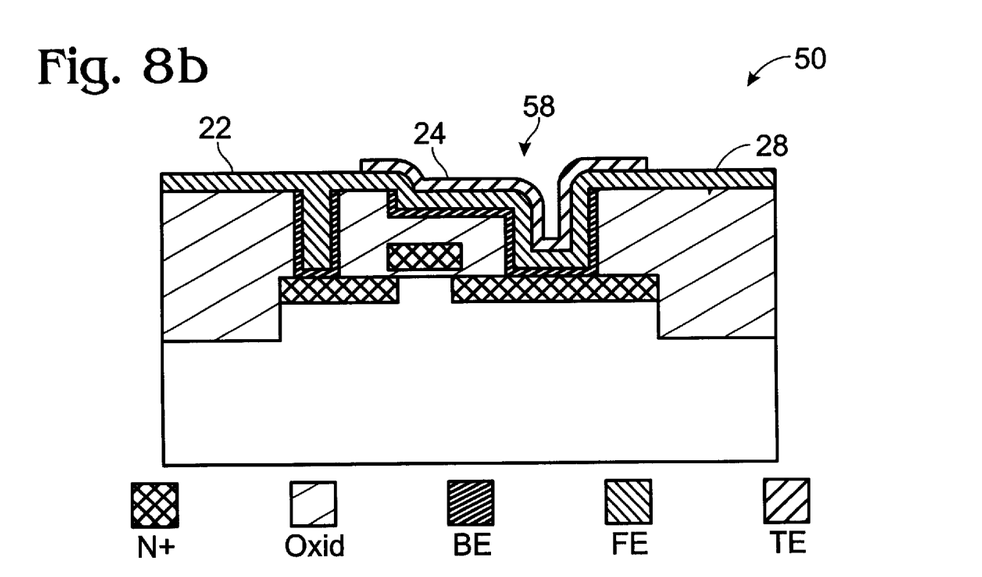

FIGS. 8a and 8b depict the patterned etching of top electrode 24 to substantially complete ferroelectric capacitors 16/58 of FIGS. 7a and 7b, respectively.

Figure 9A:
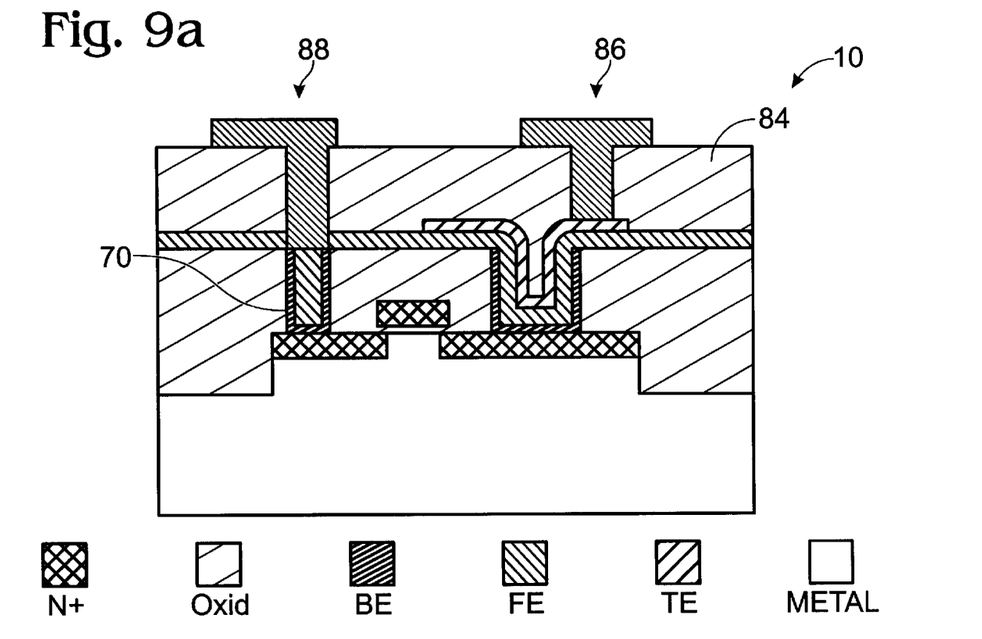
Figure 9B:
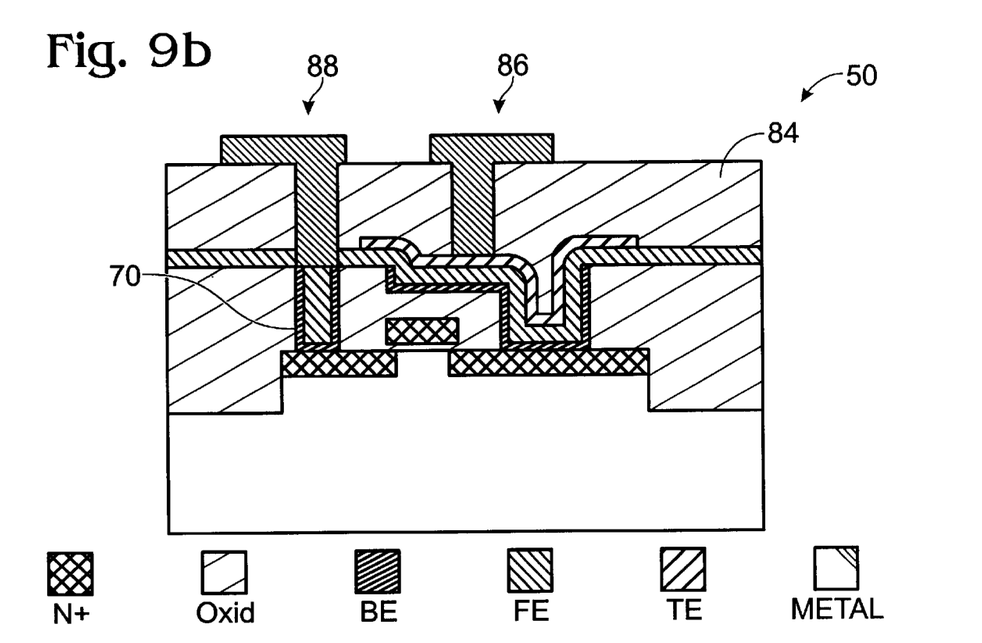

FIGS. 9a and 9b depict the deposition of a second dielectric interlevel 84 overlying ferroelectric devices 10/50 of FIGS. 8a and 8b, respectively. Second dielectric interlevel 84 is patterned to form interconnect vias 86 and 88 through second dielectric interlevel 84. Typically, the connection through via 86 is to ground and the connection through via 88 is to Vcc. Alternately (but not shown), interconnect structure 70 is a prior art metal interconnect structure formed through different process steps than used to form ferroelectric capacitors 16 and 58.

Figure 10:
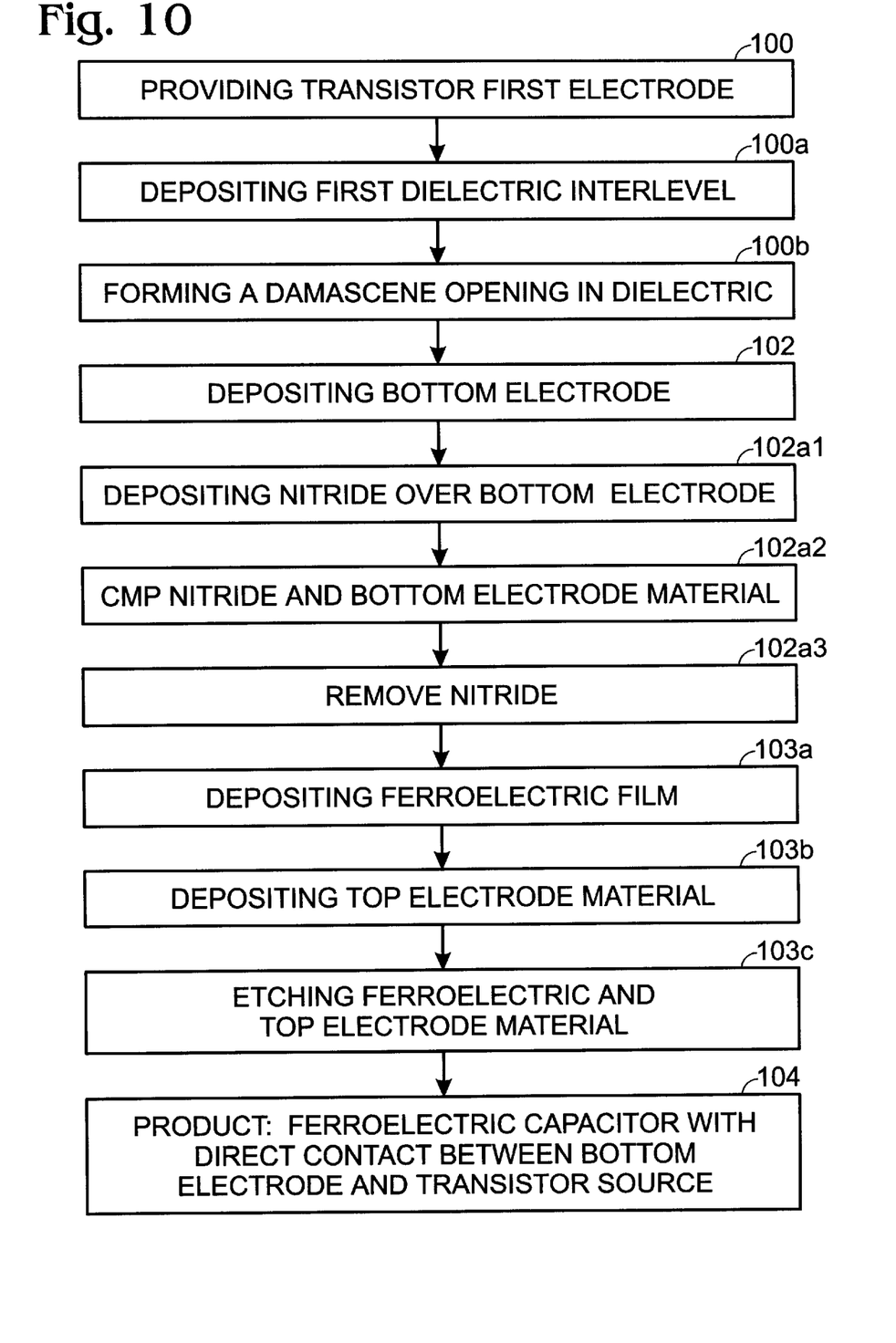
FIG. 10 illustrates steps in a method for forming a ferroelectric device of the present invention.

FIG. 10 illustrates steps in a method for forming a ferroelectric device of the present invention. Step 100 provides for the formation of a transistor including a first electrode. In some aspects of the invention the transistor is a MOS device and the first electrode is a source electrode. Step 102 forms a ferroelectric capacitor first bottom electrode immediately overlying the transistor first electrode. In some aspects of the invention the first bottom electrode includes a noble metal material. Then, Step 102 includes the first bottom electrode being made of material is selected from the group consisting of Pt, Ir, Pd, Rh, $IrO_2$, TaN, and alloy and compounds of the above-mentioned materials. Step 104 is a product, where the ferroelectric capacitor is formed without an intervening electrical connector between the transistor first electrode and the first bottom electrode.

The present invention is also novel in its use of a damascene process in the formation of the ferroelectric capacitor. Typically, further steps follow Step 100, and precede Step 102. Step 100a forms a first dielectric interlevel layer with a top surface overlying the transistor first electrode. Step 100b forms a first via opening with via sidewalls from said the dielectric interlevel layer top surface to selected area of the transistor first electrode. In this manner, a damascene ferroelectric capacitor structure is formed. Then, Step 102 includes forming the first bottom electrode overlying the first via sidewalls and the via bottom adjoining the transistor first electrode.

Step 102 includes isotropically depositing a noble metal material overlying the first dielectric interlevel top surface, the via sidewalls, and the transistor first electrode selected area. Then, a further sub-step, follows Step 102. Step 102a removes the first bottom electrode material overlying the first dielectric interlevel top surface. As mentioned above, the bottom electrode material overlying the dielectric interlevel top surface can be removed by CMP at the risk of weakening the bottom electrode sleeve along the sidewalls. Alternately, Step 102a includes the following three step procedure. Step $102a_1$ deposits nitride overlying the first dielectric interlevel top surface and transistor first electrode selected area. Step $102a_2$ chemical mechanically polishes (CMP) to remove the nitride and bottom electrode material overlying the first dielectric interlevel top surface. Step $102a_3$ etches to remove the nitride not removed in Step $102a_2$ in the via overlying the transistor first electrode selected area, whereby the first bottom electrode material is left overlying the first via sidewalls and the transistor first electrode selected area.

Further steps also follow Step 102. Step 103a forms a first ferroelectric film overlying the first bottom electrode. Step 103a includes the first ferroelectric film being made from material selected from the group consisting of PGO, PZT, SBT, SBTN, PLT, and PLZT. Step 103b forms a first top electrode layer overlying the first ferroelectric film, whereby the first via sidewalls are lined with the first bottom electrode, the first ferroelectric film, and the first bottom electrode. It is understood that the ferroelectric film and top electrode material also cover the bottom electrode material at the bottom of the via, where the bottom electrode is adjacent the selected area of the transistor first electrode. Step 103a includes isotropically depositing the first ferroelectric film overlying the first dielectric interlevel top surface, the first via sidewalls, and the transistor first electrode selected area. Step 103b includes isotropically depositing first top electrode material overlying the first ferroelectric film material deposited in Step 103a.

Following Step 103b, Step 103c etches the first top electrode material overlying the first dielectric interlevel top surface. In some aspects of the invention Step 103c includes etching the first ferroelectric film overlying the first dielectric interlevel top surface.

Step 100b includes the first via having a first diameter ($D_1$), Step 102 includes the first bottom electrode having a thickness ($T_{BE}$), Step 103b includes the first top electrode having a thickness ($T_{TE}$), and Step 103a includes the first ferroelectric film having a thickness ($T_F$). Then, D is greater than approximately $2(T_{BE})+(T_{TE})+2(T_F)$. Typically, $T_{BE}$ and $T_{TE}$ are in the range of approximately 0.1 to 0.2 microns, and $T_F$ is in the range of approximately 0.1 to 0.4 microns.

Step 106 (not shown) deposits a second dielectric interlevel with a top surface overlying the first dielectric interlevel top surface and the first top electrode. Step 108 (not shown) forms a third via in the second dielectric interlevel from the second dielectric interlevel top surface to selected areas of the first top electrode. Step 110 (not shown) fills the third via with a metal material to form an electrical interconnection to the first top electrode, whereby an electrical connection is made to the first top electrode. Typically, this interconnect is used to ground the ferroelectric capacitor. A similar fourth via in the second dielectric is often used to form an interconnect to the transistor drain.

It saves process steps to form the interlevel interconnect to the transistor drain with the same, above-mentioned, processes used to form the ferroelectric capacitor. Step 100 includes forming a transistor second electrode. Step 100a includes depositing the first dielectric interlevel overlying the transistor second electrode, and Step 100b includes forming a second via opening, with second via sidewalls, extending from said first dielectric interlevel layer top surface to selected areas of the transistor second electrode. In subsequent steps an electrical interconnection through the second via is formed to the transistor second electrode. Specifically, Step 102 includes forming a second bottom electrode overlying the transistor second electrode and the second via sidewalls, and Step 103a includes forming a second ferroelectric film overlying the second bottom electrode.

Step 100b includes the second via having a second diameter ($D_2$), with $D_{OC}$ being the minimum diameter contact hole size. Step 102 includes the second bottom electrode having a thickness ($T_{BE}$). $D_2$ is greater than approximately $2(T_{BE})+D_{OC}$. Typically, $D_{OC}$ is approximately 0.2 microns.

In one aspect of the invention Step 100b includes forming a dual damascene opening in the first dielectric interlevel. The dual damascene opening includes the first via, mentioned above, and a first trench, having first via and first trench sidewalls, as well as a trench bottom. Then, Step 102 includes forming the ferroelectric capacitor first bottom electrode overlying the transistor first electrode selected area, and overlying the first via and first trench sidewalls, as well as the first trench bottom in the dual damascene opening. In this manner, a larger sized ferroelectric capacitor, with a larger capacitance, is fabricated.

Specifically, Step 102 includes isotropically depositing the first bottom electrode material overlying the first via and first trench sidewalls, trench bottoms, and transistor first electrode selected area. Step 103a includes isotropically depositing the first ferroelectric film material overlying the first bottom electrode formed in Step 102. Step 103b includes isotropically depositing the first top electrode layer overlying the first ferroelectric film, whereby the dual damascene structure sidewalls are lined with the first bottom electrode, the first ferroelectric film, and the first bottom electrode.

In some aspects of the invention, Step 100 includes forming a transistor gate electrode. Then, Step 100a includes the first dielectric interlevel being formed overlying the gate electrode, and Step 100b includes the dual damascene trench being formed, at least partially, overlying the gate electrode, whereby the space surrounding transistor is optimally occupied.

The above-mentioned ferroelectric structure and fabrication method is useful for a variety of reasons. The process permits immediate contact between a noble metal capacitor electrode and a transistor electrode. This immediate connection minimizes the number of process steps and the electrical resistance between the capacitor and the transistor. The simplified capacitor electrode formation process makes the task of etching the noble metal less critical. Regardless of whether a noble metal capacitor electrode is used, the damascene formation process permits the formation of larger capacitors is space efficient shapes. One embodiment of the invention permits the capacitor formation process to be used simultaneously with the formation of interlevel interconnections to the transistor drain. Another embodiment depicts the formation of a dual damascene ferroelectric capacitor. Other variations and embodiments will occur to those skilled in the art.

What is claimed is:

1. A method of forming a ferroelectric device comprising the steps of:

a) forming a transistor including a first electrode; and b) forming a ferroelectric capacitor first bottom electrode, including a noble metal, immediately overlying the transistor first electrode, whereby the ferroelectric capacitor is formed without an intervening electrical connector between the transistor first electrode and the first bottom electrode.

2. A method as in claim 1 further comprising the steps, following Step a), of:

$a_1$) forming a first dielectric interlevel layer with a top surface overlying the transistor first electrode; and a₂) forming a first via opening with via sidewalls from said the dielectric interlevel layer top surface to a selected area of the transistor first electrode, whereby a damascene ferroelectric capacitor structure is formed.

3. A method as in claim 2 in which Step b) includes forming the first bottom electrode overlying the first via sidewalls.

4. A method as in claim 3 comprising the further step, following Step b), of:
   c) forming a first ferroelectric film overlying the first bottom electrode; and
   d) forming a first top electrode layer overlying the first ferroelectric film, whereby the first via sidewalls are lined with the first bottom electrode, the first ferroelectric film, and the first bottom electrode.

5. A method as in claim 2 in which Step b) includes isotropically depositing a noble metal material overlying the first dielectric interlevel top surface, the via sidewalls, and the transistor first electrode selected area; and
   including a further sub-step, following Step b), of:
   b₁) removing the first bottom electrode overlying the first dielectric interlevel top surface.

6. A method as in claim 5 in which sub-Step b₁) includes the following procedures:
   b₁a) depositing nitride overlying the first dielectric interlevel top surface and transistor first electrode selected area;
   b₁b) chemical mechanically polishing (CMP) to remove the nitride and bottom electrode material overlying the first dielectric interlevel top surface; and
   b₁c) etching to remove the nitride not removed previously in the via overlying the transistor first electrode selected area, whereby the first bottom electrode material is left overlying the first via sidewalls and the transistor first electrode selected area.

7. A method as in claim 6 in which Step c) includes isotropically depositing the first ferroelectric film overlying the first dielectric interlevel top surface, the first via sidewalls, and the transistor first electrode selected area; and,
   including a further step of:
   d) forming a first top electrode layer overlying the first ferroelectric film by isotropically depositing first top electrode material overlying the first ferroelectric film material deposited in Step c).

8. A method as in claim 7 further comprising a step, following Step d), of:
   e) etching the first top electrode material overlying the first dielectric interlevel top surface.

9. A method as in claim 8 in which Step e) includes etching the first ferroelectric film overlying the first dielectric interlevel top surface.

10. A method as in claim 4 including further steps, following Step b), of:
    f) depositing a second dielectric interlevel with a top surface overlying the first dielectric interlevel top surface and the first top electrode;
    g) forming a third via in the second dielectric interlevel from the second dielectric interlevel top surface to selected areas of the first top electrode; and
    j) filling the third via with a metal material to form an electrical interconnection to the first top electrode, whereby an electrical connection is made to the first top electrode.

11. A method as in claim 4 in which Step a) includes forming a transistor second electrode, in which Step a₁) includes depositing the first dielectric interlevel overlying the transistor second electrode, in which Step a₂) includes forming a second via opening, with second via sidewalls, extending from said first dielectric interlevel layer top surface to selected areas of the transistor second electrode; and
    forming an electrical interconnection through the second via to the transistor second electrode.

12. A method as in claim 11 in which Step b) includes forming a second bottom electrode overlying a selected area of the transistor second electrode and the second via sidewalls, and in which Step c) includes forming a second ferroelectric film overlying the second bottom electrode.

13. A method as in claim 12 in which Step a₂) includes the second via having a second diameter ($D_2$), with $D_{OC}$ being the minimum diameter contact hole size, in which Step b) includes the second bottom electrode having a thickness ($T_{BE}$), and in which $D_2$ is greater than approximately $2(T_{BE})+D_{OC}$.

14. A method as in claim 13 in which $D_{OC}$ is approximately 0.2 microns.

15. A method as in claim 4 in which Step a₂) includes forming a dual damascene opening in the first dielectric interlevel including the first via and a first trench, having first via and first trench sidewalls, and in which Step b) includes forming the ferroelectric capacitor first bottom electrode overlying the transistor first electrode selected area, the first via and first trench sidewalls, and the trench bottom in the dual damascene opening, whereby a larger sized ferroelectric capacitor has a larger capacitance.

16. A method as in claim 15 in which Step b) includes isotropically depositing the first bottom electrode material overlying the first via and first trench sidewalls, the trench bottom, and the transistor first electrode selected area, in which Step c) includes isotropically depositing the first ferroelectric film material overlying the first bottom electrode formed in Step b), and Step d) includes isotropically depositing the first top electrode layer overlying the first ferroelectric film, whereby the dual damascene structure sidewalls are lined with the first bottom electrode, the first ferroelectric film, and the first top electrode.

17. A method as in claim 16 in which Step a) includes forming a transistor gate electrode, in which Step a₁) includes the first dielectric interlevel being formed overlying the gate electrode, and in which Step a₂) includes the dual damascene trench being formed, at least partially, overlying the gate electrode, whereby the space surrounding said transistor is optimally occupied.

18. A method as in claim 4 in which Step a₂) includes the first via having a first diameter ($D_1$), in which Step b) includes the first bottom electrode having a thickness ($T_{BE}$), in which Step d) includes the first top electrode having a thickness ($T_{TE}$), in which Step c) includes the first ferroelectric film having a thickness ($T_F$), and in which D is greater than approximately $2(T_{BE})+(T_{TE})+2(T_F)$.

19. A method as in claim 18 in which $T_{BE}$ and $T_{TE}$ are in the range of approximately 0.1 to 0.2 microns, and in which $T_F$ is in the range of approximately 0.1 to 0.4 microns.

20. A method as in claim 1 in which Step b) includes the first bottom electrode being made of material is selected from the group consisting of Pt, Ir, Pd, Rh, $IrO_2$, and alloys and compounds of the abovementioned noble metals.

21. A method as in claim 4 in which Step c) includes the first ferroelectric film being made from material selected from the group consisting of PGO, PZT, SBT, SBTN, PLT, and PLZT.

22. A method as in claim 1 in which Step a) includes the transistor first electrode being a source.

23. A method of forming a ferroelectric device comprising the steps of:

a) forming a transistor including an first electrode;

b) forming a first dielectric interlevel layer with a top surface overlying the transistor;

c) forming a first via opening with via sidewalls extending from said first dielectric interlevel layer top surface to selected area of the transistor first electrode; and d) forming a ferroelectric capacitor having a first bottom electrode immediately overlying the transistor first electrode, whereby the ferroelectric capacitor is formed without an intervening electrical connector between the first electrode and the first bottom electrode.

* * * * *